United States Patent [19]
Aketagawa et al.

[11] Patent Number: 5,284,521
[45] Date of Patent: Feb. 8, 1994

[54] VACUUM FILM FORMING APPARATUS

[75] Inventors: Ken-ichi Aketagawa; Junro Sakai; Shun-ichi Murakami; Hiroyoshi Murota, all of Fuchu; Toru Tatsumi, Tokyo, all of Japan

[73] Assignees: Anelva Corporation; NEC Corporation, both of Tokyo, Japan

[21] Appl. No.: 754,522

[22] Filed: Sep. 4, 1991

[30] Foreign Application Priority Data

Sep. 21, 1990 [JP] Japan .................. 2-253191

[51] Int. Cl.$^5$ ................................ C23C 16/00
[52] U.S. Cl. ..................... 118/719; 118/725
[58] Field of Search ................. 118/719, 725

[56] References Cited

U.S. PATENT DOCUMENTS

| | | | |
|---|---|---|---|
| 3,156,591 | 11/1964 | Hale et al. | 437/89 |
| 3,394,678 | 7/1968 | Edwards | 118/726 |
| 4,767,251 | 8/1988 | Whang | 414/147 |
| 4,895,107 | 1/1990 | Yano | 118/719 |
| 4,989,543 | 2/1991 | Schmitt | 118/725 |
| 5,107,791 | 4/1992 | Hirokawa | 118/726 |
| 5,180,432 | 1/1993 | Hansen | 118/725 |

FOREIGN PATENT DOCUMENTS

| | | |
|---|---|---|
| 0319122 | 6/1989 | European Pat. Off. |
| 238263 | 10/1988 | Japan |
| 230225 | 9/1989 | Japan |
| 230226 | 9/1989 | Japan |
| 257322 | 10/1989 | Japan |
| 2-24223 | 10/1991 | Japan |

OTHER PUBLICATIONS

"Silicon epitaxy on germanium using a SiH$_4$ low-pressure chemical-vapor deposition process" Fujinaga et al. Japan Vacuum Society Technology, B5(6) Nov./Dec. 1987, pp. 1551-1554.

"High-rate growth at low temperatures by free-jet molecular flow: Surface-reaction film-formation technology" Ohmi et al., Applied Physics Letter 52(14) Apr. 4th, 1988, pp. 1173-1175.

*Primary Examiner*—Richard Bueker
*Attorney, Agent, or Firm*—Spencer, Frank & Schneider

[57] ABSTRACT

A vacuum film forming apparatus including a vacuum vessel having an interior divided into a first vacuum chamber and a second vacuum chamber. First evacuating means is arranged for the first vacuum chamber while it is communicated with the first vacuum chamber, and second evacuating means is arranged for the second vacuum chamber while it is communicated with the second vacuum chamber. In addition, a substrate heater is arranged in the first vacuum chamber, and gas supplying means is arranged in the second vacuum chamber. The apparatus further includes a substrate holder for holding a substrate thereon such that a film forming surface of the substrate is oriented toward the second vacuum chamber. The substrate holder is arranged at a position where the first vacuum chamber and the second vacuum chamber are gastightly isolated from each other with the substrate holder interposed therebetween together with the substrate.

10 Claims, 8 Drawing Sheets

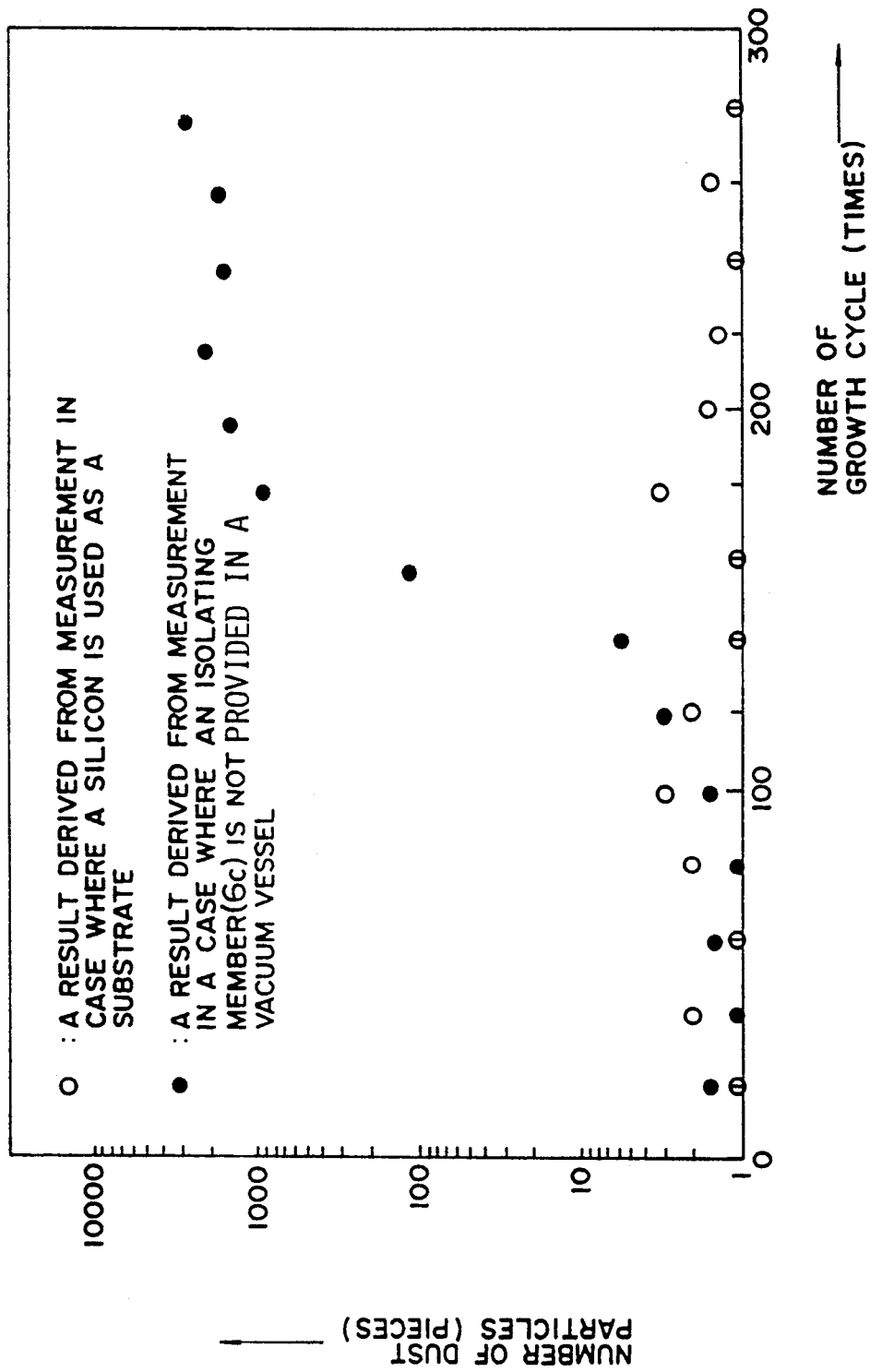

5,284,521

VACUUM FILM FORMING APPARATUS

BACKGROUND OF THE INVENTION

The present invention relates to a vacuum film forming apparatus of the type including a substrate heating unit in a vacuum chamber so as to epitaxially grow a semiconductor film on a substrate.

Many proposals have been hitherto made as to a vacuum film forming apparatus of the foregoing type. For example, a chemical vapor deposition method closely associated with the film forming apparatus including a substrate heater is described in each of the following documents.

U.S. Pat. No. 3,156,591 granted to Arthur P. Hale, et al. to provide a chemical vapor deposition method and titled "Epitaxial growth through silicon dioxide mask in a vacuum vapor deposition process", Paper published by T. Ohmi, et al. in Applied Physics Letter 52(14) published Apr. 4, 1988 and titled "High-rate growth at low temperatures by free-jet molecular flow: Surface-reaction film-forming technology", Paper published by K. Fujinaga, et al. in Journal of Vacuum Society B5(6) published Dec. 11, 1987 and titled "Silicon epitaxy on germanium using a $SiH_4$ low-pressure chemical-vapor deposition process", Japanese Patent Application Laid-Open No. 257322/1989 titled "Method of producing a semiconductor", Japanese Patent Application Laid-Open No. 230225/1989 titled "Apparatus for producing a semiconductor", and Japanese Patent Application Laid-Open No. 230226/1989 titled "Apparatus for producing a semiconductor".

With respect to a conventional gas source epitaxy apparatus including a substrate heater such that a heat source required for heating a substrate is arranged in a vacuum chamber, not only the substrate but also the heat source are exposed to a source gas.

When the substrate is heated in the conventional apparatus as a source gas is introduced into a treatment chamber, the source gas is thermally decomposed on the heat source as well as in the region peripheral to the heat source, whereby a resultant product is produced in a wide region inclusive of the substrate to be treated.

In addition, when a resultant product is deposited on a substrate heating unit, there arise some problems in that the thermal insulating property of the substrate heating unit is degraded, the heater serving as a heat source fails to be turned on, the intensity of heat ray irradiation from the heat source fluctuates, and the uniformity of heat ray irradiation is deteriorated.

Additionally, it has been found that a resultant product deposited on the substrate heating unit and other components leads to a the formation of dust particles, resulting in the rate at which a thin film is formed being reduced undesirably.

Further, another problem is that impurities such as carbon or the like fly from the heater onto the substrate as the heater is heated.

SUMMARY OF THE INVENTION

The present invention has been made in consideration of the aforementioned problems.

Therefore, an object of the present invention is to provide a vacuum film forming apparatus which prevents a product from being deposited through pyrolysis of the source gas which has flowed to the heat source as well as to a region peripheral to the heat source.

Another object of the present invention is to provide a vacuum film forming apparatus which prevents a gas other than the source gas flowing from the heat source from flowing onto the surface of the heat source.

To accomplish the above objects, the present invention provides a vacuum film forming apparatus wherein the apparatus comprises a vacuum vessel including a first vacuum chamber and a second vacuum chamber; first and second evacuating means, the first evacuating means being communicated with the first vacuum chamber and the second evacuating means being communicated with the second vacuum chamber; a substrate heater arranged in the first vacuum chamber; a gas supplying system arranged in the second vacuum chamber and a substrate holder serving to hold a substrate having a film forming surface oriented toward the second vacuum chamber, the substrate holder being arranged at a position where the first vacuum chamber and the second vacuum chamber are isolated from each other with the substrate holder interposed therebetween together with the substrate.

According to the present invention, the substrate holder comprises a member serving as an isolating member for gastightly isolating the first vacuum chamber from the second vacuum chamber while holding the substrate thereon. The foregoing member is vertically displaceably arranged on an inner wall of the vacuum vessel.

The substrate holder is constituted by using the same material as that of a thin film to be deposited on the substrate.

To assure that the substrate is replaced with another by displacing the substrate holder, actuating means in the form of a linear motion feedthrough is arranged at a position outside of the vacuum vessel in an environmental atmosphere.

It is preferable that the substrate heater comprises an electric heater.

In addition, it is preferable that the gas supplying system comprises a nozzle through which a source gas is blown toward the substrate.

Further, it is preferable that the evacuating means arranged for each of the first vacuum chamber and the second vacuum chamber comprises a turbo molecular pump.

The evacuating speed of the evacuating means arranged for the first vacuum chamber is mode smaller than the evacuating speed of the second evacuating means arranged for the second vacuum chamber.

With the apparatus of the present invention, the thin film to be deposited on the substrate is an epitaxial silicon film.

Since the apparatus of the present invention is constructed in the above-described manner, the gas which has been introduced toward a surface of the substrate to be treated does not reach a substrate heating unit arranged on the rear side relative to the substrate.

Thus, no deposited product is produced on the substrate heating unit. In addition, impurities such as carbon or the like generated when a heat source is heated do not fly onto the surface of the substrate to be treated.

As the substrate holder is heated together with the substrate, a product is deposited on the substrate holder. However, since the substrate holder is constituted by using the same material as that of the film to be formed, peeling of the resultant product due to a difference between the material of the deposited product and the material of the substrate holder hardly takes place. Consequently, undesirable formation of dust particles attributable to an occurrence of peeling can be prevented reliably.

Other objects, features and advantages of the present invention will become apparent from reading of the following description which has been made in conjunction with the accompanying drawings.

BRIEF DESCRIPTION OF THE DRAWINGS

FIG. 3 is a graph which shows the relationship between the number of times of growth cycle and the number of dust particles on the surface of a substrate wherein a silicon film is epitaxially grown by using disilane gas;

FIG. 4(a) is a depth profile drived using a vacuum film forming apparatus of the present invention and FIG. 4(b) is a depth profile drived using a conventional vacuum film forming apparatus.

DESCRIPTION OF THE PREFERRED EMBODIMENTS

The present invention will be described in detail hereinafter with reference to the accompanying drawings which illustrate preferred embodiments of the present invention. It should be noted that the accompanying drawings schematically illustrate the size and configuration of each component as well as an arrangement relationship among the respective components to such an extent that any expert in the art can understand the foregoing items by himself without any particular difficulty.

Figure 1:
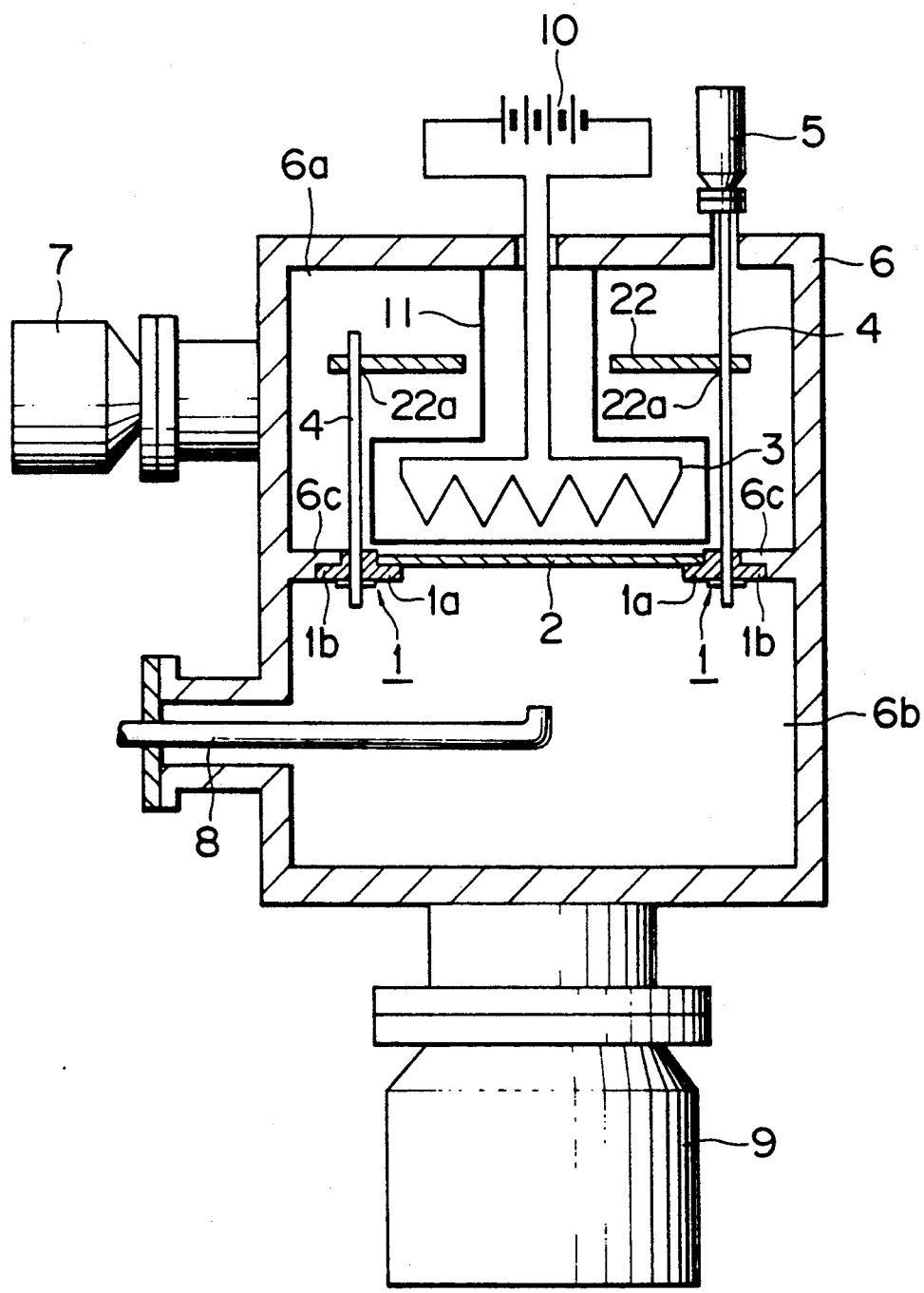
FIG. 1 is a partial schematic diagram which schematically illustrates the structure of an embodiment of a vacuum film forming apparatus according to the present invention.

FIG. 1 is a partial schematic diagram of a vacuum film forming apparatus in accordance with an embodiment of the present invention. As is apparent from the drawing, the vacuum film forming apparatus according to the present invention is constructed such that a silicon film is grown on a silicon substrate by using a disilane gas.

The apparatus includes a vacuum vessel having an interior divided into an upper vacuum chamber portion (the first vacuum chamber) 6a on the heater side and a lower vacuum chamber portion (the second vacuum chamber) 6b on the treatment side.

The vacuum vessel 6 includes a rim or flange 6c which extends around the inner wall surface thereof to serve as an isolating member for gastightly isolating the first vacuum chamber 6a from the second vacuum chamber 6b.

In addition, the vacuum vessel 6 is provided with a silicon substrate 2 serving as a substrate to be treated as well as a substrate holder 1 for holding the silicon substrate 2 at a position located in alignment with the rim 6c.

A turbo molecular pump 7 is arranged for evacuating the first vacuum chamber 6a, while another turbo molecular pump 9 is arranged for evacuating the second vacuum chamber 6b.

According to the embodiment of the present invention, the turbo molecular pump 7 is designed to have an evacuating speed of 300 liters/sec. and the turbo molecular pump 9 is designed to have an evacuating speed of 1000 liters/sec.

A cylindrical holder 11 is arranged at the central part of the first vacuum chamber 6a for holding a substrate heating unit including a heater 3 for heating the silicon substrate 2.

The heater 3 is fed with electricity from a direct current supply source 10 arranged outside of the vacuum vessel 6 for the purpose of heating.

Further, the silicon substrate 2 can be heated by a radiant heater (not shown), such as a lamp heater, arranged outside of the vacuum vessel 6. In this case, through a quartz viewing port (not shown) disposed on the vacuum vessel 6, a radiant ray is radiated on to the rear surface of the silicon substrate 2.

Figure 6:
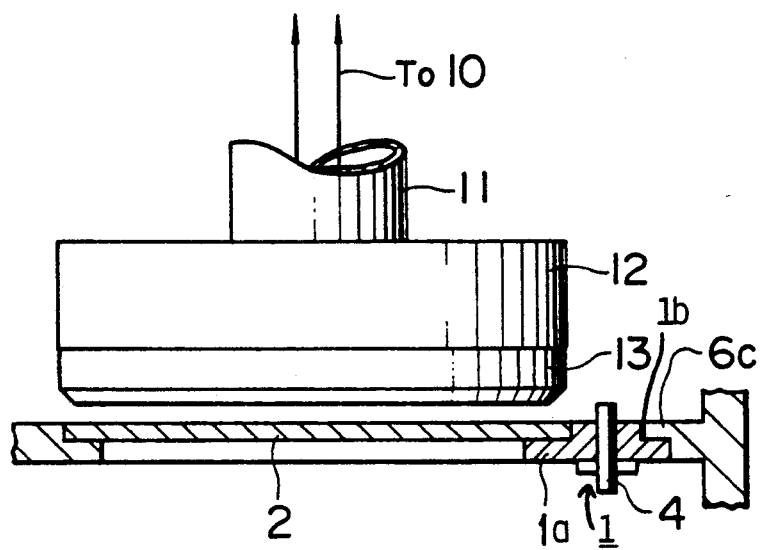
FIG. 6 is a fragmentary sectional side view of the apparatus shown in FIG. 1, particularly illustrating the arrangement of a heater.

FIG. 6 is a side view which shows the appearance of the substrate heating unit. A dish-shaped receiving tray 13 of quartz is removably attached to the bottom of a container 12 integrated with the cylindrical holder 11 so that the heater 3 irradiates heat rays toward the silicon substrate 2 through the tray 13 of the container 12.

On the other hand, the second vacuum chamber 6b is equipped with a gas nozzle 8 on the side wall thereof through which nitrogen gas is introduced into the second vacuum chamber 6b as described later, and a nozzle port at the foremost end of the gas nozzle 8 is opened upwardly at the position above the intermediate part of the second vacuum chamber 6b.

The substrate holder 1 serving to hold the silicon substrate 2 is designed in an annular configuration and has an inner stepped part 1a and an outer stepped part 1b so as to hold the outer periphery the silicon substrate 2 around the inner stepped part 1a.

The first vacuum chamber 6a includes a plurality of support rods 4 of which the lowermost ends are fixedly secured to the substrate holder 1, and the upper ends of the support rods 4 are inserted through guide holes 22a on a guide plate 22 which is fixed to the first vacuum chamber 6a via a suitable member (not shown).

One of the support rods 4 extends upwardly through the upper wall of the first vacuum chamber 6a until it is operatively connected to a linear motion feedthrough 5.

As the linear motion feedthrough 5 is actuated, the support rod 4 is raised up or lowered and thereby the substrate holder 1 is raised up or lowered via the support rod 4.

FIG. 1 shows the operative state wherein the substrate holder 1 having the silicon substrate 2 held thereon is raised up by actuation of the linear motion feedthrough 5 so that the first vacuum chamber 6a and the second vacuum chamber 6b are gastightly isolated from each other by bringing the outer stepped part 1b of the substrate holder 1 in close contact with the inner periphery of the rim 6c.

After a silicon film is formed on the silicon substrate 2 while a source gas ($Si_2H_6$) is supplied into the second vacuum chamber 6b from the gas supplying means, the substrate holder 1 is lowered by actuation of the linear motion feedthrough 5. Then, the silicon substrate 2 held on the substrate holder 1 is taken out of the vacuum vessel 6 with the aid of a conveying arm (not shown) so that it is conveyed to a substrate exchanging room (not shown).

Subsequently, another silicon substrate 2 to be next treated is conveyed to the vacuum vessel 6 so that it is placed on the inner stepped part 1a of the substrate holder 1 with the aid of the conveying arm. At this time, the substrate holder 1 is set as illustrated in FIG. 1.

Since the silicon substrate 2 does not serve as an isolating member for partitioning the chambers 6a and 6b during the aforementioned conveying operation, the pressure in the first vacuum chamber 6a is equalized to the pressure in the second vacuum chamber 6b.

It should be noted that the conveying arm and the substrate exchanging chamber are arranged in locations rearward or forward of the drawing plane as seen in FIG. 1.

The present invention has been described above with respect to an embodiment wherein the vacuum vessel is constructed in a cylindrical configuration. However, the present invention is not be limited only to this configuration. Alternatively, the vacuum vessel may be constructed in other configurations.

Figure 2:
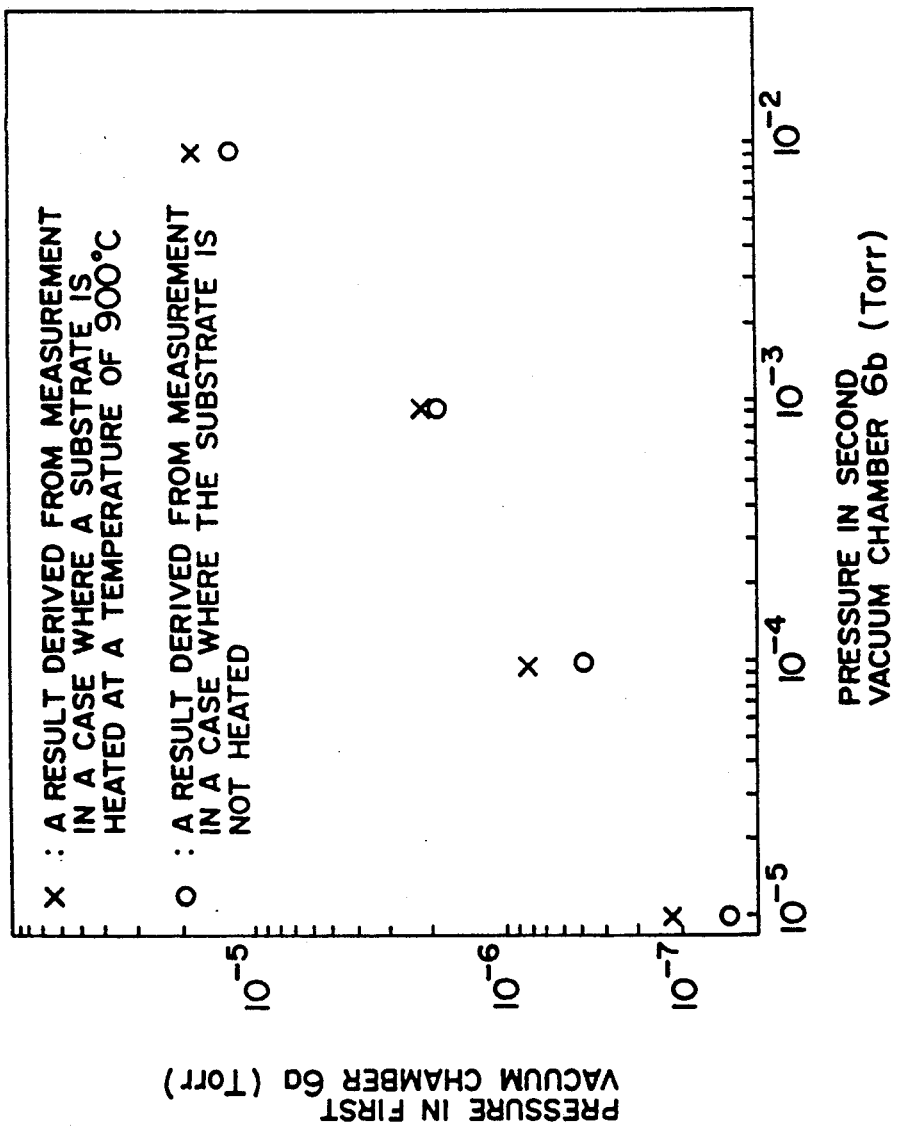
FIG. 2 is a graph which shows the relationship between a pressure in a first vacuum chamber and the pressure in a second vacuum chamber wherein a nitrogen gas is introduced into the second vacuum chamber through a gas nozzle.

FIG. 2 is a graph which shows results derived from measurements conducted for a pressure difference between the pressure in the first vacuum chamber 6a and the pressure in the second vacuum chamber 6b in a case where a nitrogen gas is introduced into the second vacuum chamber 6b through the gas nozzle 8 serving as the gas supplying means.

In FIG. 2, small circle marks represent a case where measurements were conducted when the substrate is not heated, i.e., at room temperature and X marks represent a case where measurements were conducted when the substrate is heated at a temperature of 900° C., wherein the ordinate designates the pressure in the first vacuum chamber 6a and the abscissa designates the pressure in the second vacuum chamber 6b.

As is apparent from the graph in FIG. 2, there appears a differential pressure having two or more orders of magnitude between the pressure in the first vacuum chamber 6a and the pressure in the second vacuum chamber 6b.

It has been found that the functional effect derived from the isolating member is satisfactorily obtained by arrangement of the substrate 2 and the substrate holder 1 in consideration of the operational condition when the substrate is heated.

As exemplified above, the evacuating speed of the turbo molecular pump 7 installed for the first vacuum chamber 6a is determined to be smaller than that of the turbo molecular pump 9 installed for the second vacuum chamber 6b. In spite of this fact, the pressure in the first vacuum chamber 6a is higher by twice that of the second vacuum chamber 6b. This means that the isolating effect derived by the arrangement of the substrate 2 and the substrate holder 1 is remarkably high.

It is obvious from results obtained from measurements that the quantity of introduced gas flowing around the substrate heating unit is very small, that the running life of the substrate heating unit is substantially lengthened, and that heat rays are uniformly irradiated from the substrate heating unit.

FIG. 3 is a graph which shows results derived from measurements conducted for the relationship between the number of times the epitaxial growth cycle was repeated and the number of dust particles deposited on the surface of a substrate in a case where a silicon film is epitaxially grown when a disilane gas is used as a source gas. It should be noted that the substrate with which measurement were conducted in the above-described manner is a substrate practically used on a mass production line with a pattern formed thereon using an oxide film. The reason why such a substrate was used in that way was to avoid adhesion of the substrate holder 1 to the substrate 2.

In FIG. 3, small white circle marks represent the results derived from measurements conducted for a relationship between the number of growth cycles and the number of dust particles in a case where the same material as that of the substrate, i.e., silicon was used for the substrate holder 1 to gastightly isolate the first vacuum chamber 6a from the second vacuum chamber 6b, while small black circle marks represent the results derived from measurements conducted for the same relationship as mentioned above for the purpose of comparison in a case where treatment was carried out under the same conditions as mentioned above except that quartz was used as a material for the substrate holder 1 and the isolating member 6c in the form of an annular rim did not exist in the vacuum vessel 6, that is, the vacuum vessel 6 is not separated gastightly between the first and the second chambers.

It is readily recognizable from the graph in FIG. 3 that the number of dust particles varies slightly no matter how many times the growth cycle was repeated in the case where the substrate holder 1 was practically used to gastightly isolate the first vacuum chamber 6a from the second vacuum chamber 6b, but the number of dust particles rapidly increases when the number of times of growth exceeds a certain numeral in the case where the isolating member 6c does not exist in the vacuum vessel 6.

In other words, FIG. 3 shows that the number of dust particles rapidly increases when the number of silicon film growth cycles exceeds 140 in the case where quartz was used as a material for the substrate holder 1 and the isolating member 6c did not exist in the vacuum vessel 6.

In a case where no isolating member is arranged in the vacuum vessel 6, the disilane gas introduced into the first vacuum chamber 6a flows around the tray 13 and adheres to the quartz tray 13 (which serves to hold the heater 3) so that a silicon film is grown on the substrate 2.

Figure 8:
FIG. 8 is a photograph which shows a quartz receiving tray removed from the apparatus, a part of a deposited silicon film being peeled therefrom.

FIG. 8 is a photograph which was taken with the quartz tray 13 removed from the vacuum vessel 6 after the silicon film growth cycle was repeated 300 times in order to show the state visually observed on the surface of the tray 13.

It is recognizable from the photograph that a blue silicon film was uniformly deposited on the surface of the tray but a part of the silicon film was later peeled therefrom. It is considered that the part of the silicon film peeled from the tray 13 leads to the formation of dust particles.

In addition, it is considered that rapid increase of the number of dust particles recognized after the number of growth cycles exceeds 140 is attributable to the fact that a part of the silicon film starts to be peeled from the surface of the tray 13 when the thickness of the silicon film deposited on the tray 13 reaches a certain value. In other words, it is considered that a stress is induced because of the difference of silicon from quartz as a material, causing the undesirable peeling to take place in the presence of the foregoing stress.

Since the silicon film is a different kind of material from that of the tray 13 of quartz, the silicon film is cracked due to the difference between the expansion coefficient of the silicon and the expansion coefficient of quartz in the presence of a strain stress appearing between the different kinds of materials at every time of film formation, resulting in partial peeling of the silicon film being started.

In such a manner, a part of the silicon film peeled from the tray 13 of quartz to serve as a substrate holder leads to the formation of dust particles.

However, when the kind of a growing film is the same as the kind of a substrate on which the film is deposited, no stress is induced therebetween because the film is integrated homogeneously with the substrate. In this case, the silicon film deposited on the substrate holder made of silicon is epitaxially grown, and the silicon film is then integrated homogeneously with the substrate holder. For this reason, there is no possibility that peeling takes place with the deposited film.

As is readily apparent from the graph in FIG. 3, very few dust particles are generated in a case where an isolating member is arranged in the vacuum vessel and when the substrate holder is made of silicon.

Figure 4A:
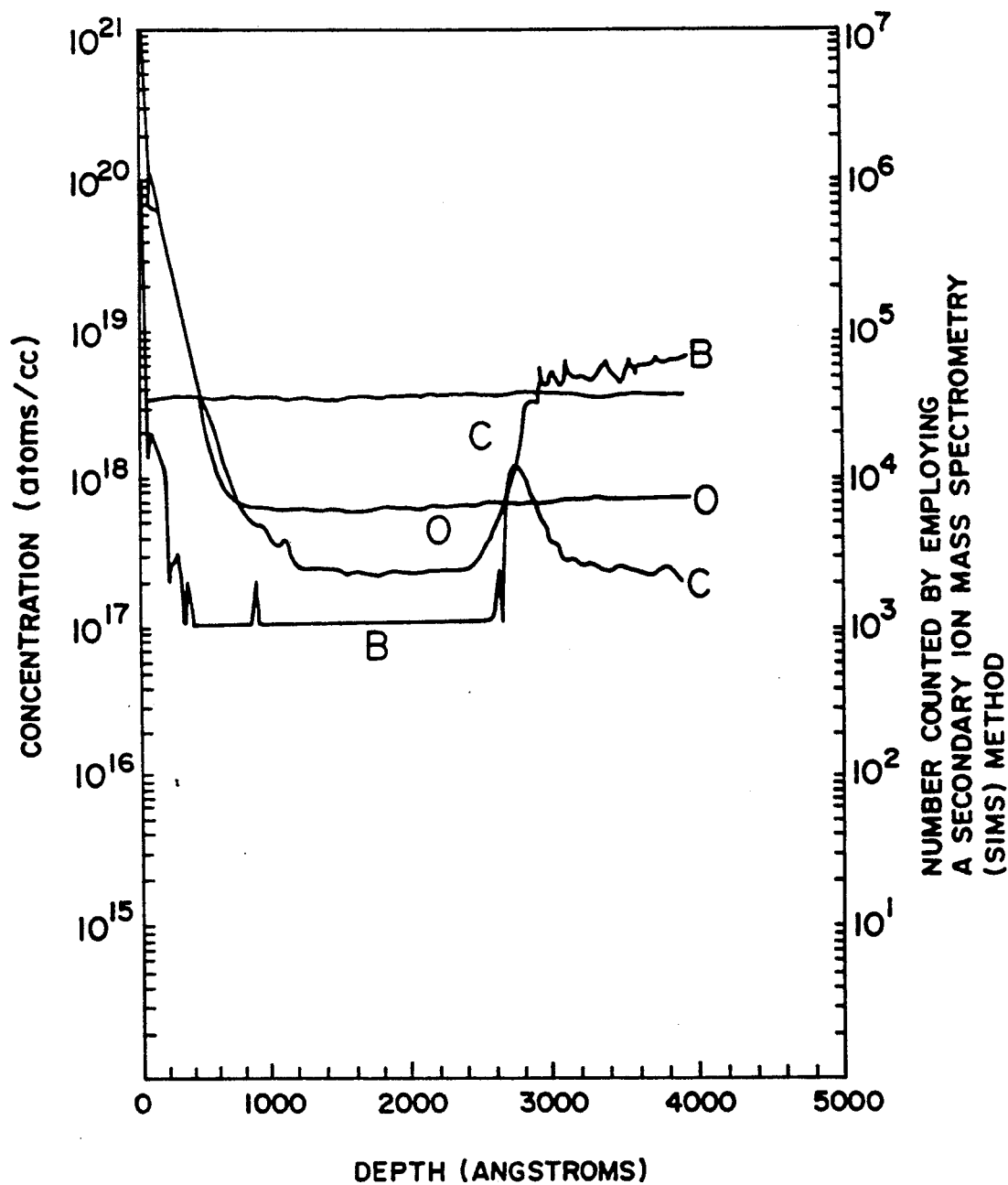
FIGS. 4(a) and 4(b) show dept profiles of carbon concentration in epitaxially grown Si which are measured by secondary ion mass spectrometry (SIMS).
Figure 4B:
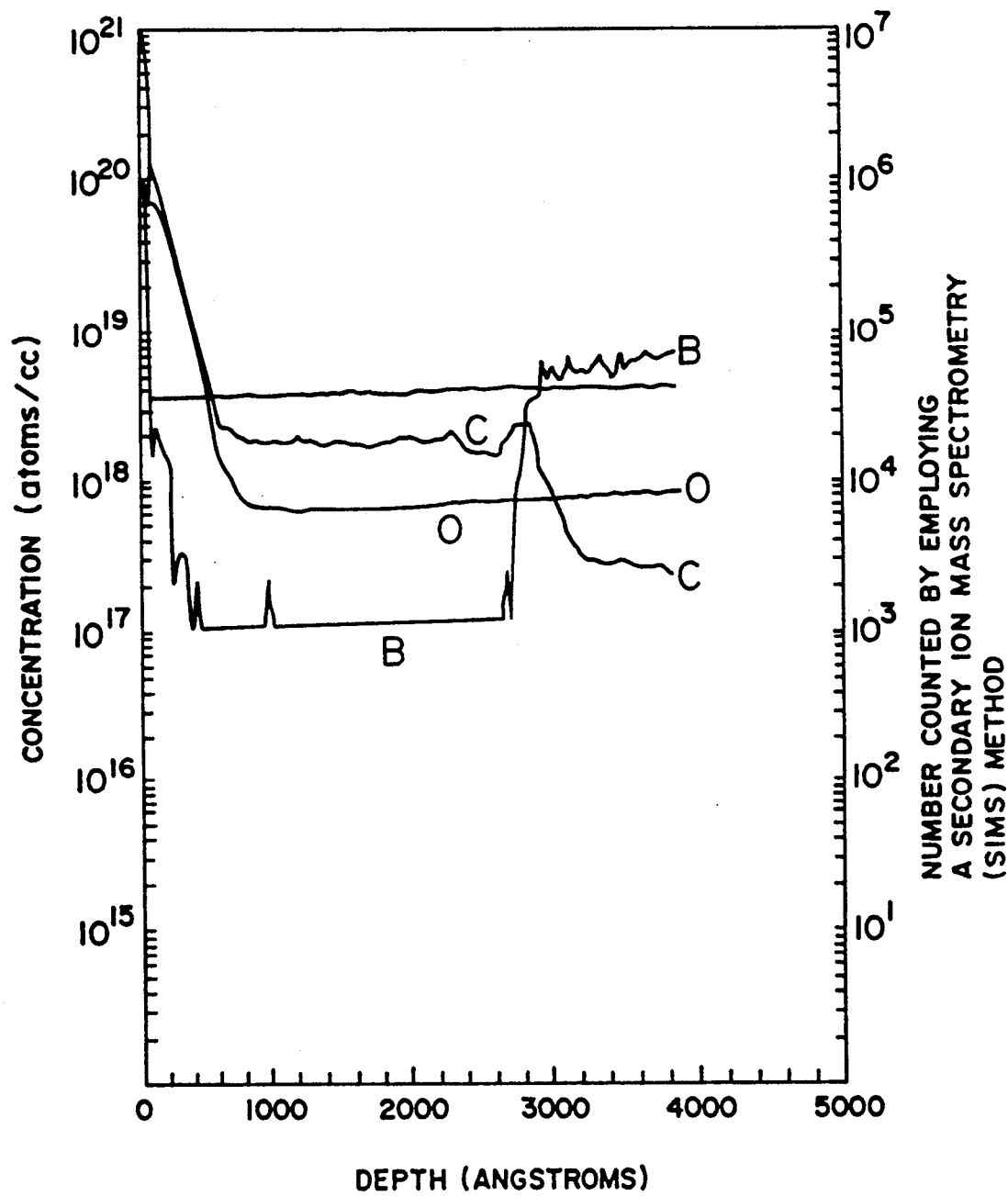

FIGS. 4(a) and 4(b) are graphs which show results derived from analyses conducted for a concentration of carbon in an epitaxially growing silicon film in the direction of a depth by employing a secondary ion mass spectrometry (SIMS) analyzing method. Specifically, FIG. 4(a) is a graph which shows results derived in a case where the apparatus of the present invention including an isolating member is used for forming a silicon film and FIG. 4(b) is a graph which likewise shows results derived in a case where a conventional apparatus including no isolating member is used for forming a silicon film, for the purpose of comparison.

As is apparent from a comparison of the two graphs, the B curves (each representing a concentration of boron) and the O curves (each representing a concentration of oxygen) extend along substantially the same loci but the C curves (each representing a concentration of carbon) extend in a different way, respectively. In detail, the graph in FIG. 4(a) clearly shows a low concentration of carbon compared with the graph in FIG. 4(b). This means that the isolating member is effective for inhibiting carbon atoms from flying from the substrate heating unit side.

Figure 7:
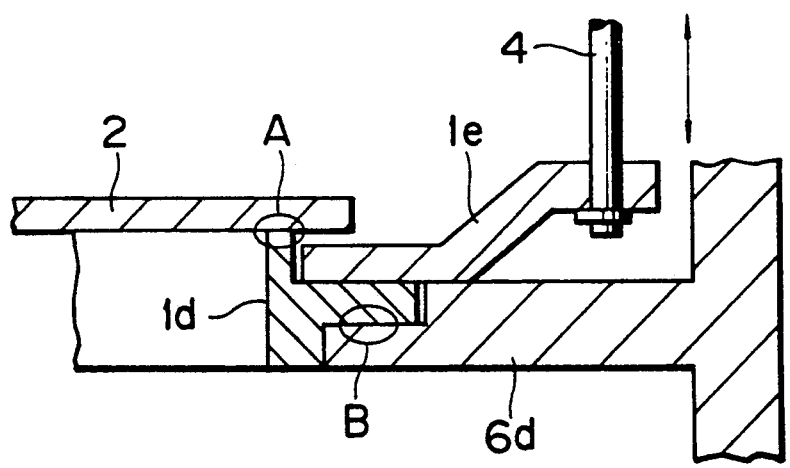
FIG. 7 is a fragmentary sectional side view of a vacuum film forming apparatus in accordance with another embodiment of the present invention, particularly illustrating the arrangement of a substrate holder.

FIG. 7 is a fragmentary sectional view of a vacuum film forming apparatus in accordance with another embodiment of the present invention, particularly illustrating the structure of a substrate holder. According to this embodiment, the substrate holder is composed of a support ring 1d for supporting a substrate 2 and a carriage 1e for displacing the substrate 2 in the upward direction. The support ring 1d is placed on a rim 6d which serves in the same manner as the rim 6c which has been described above with reference to FIG. 1.

A support rod 4 operatively connected to the carriage 1e is raised or lowered in the same manner as the support rod 4 which has likewise been described above with reference to FIG. 1, by actuating the linear motion feedthrough 5 arranged outside of the vacuum vessel 6. In this embodiment, the heating unit can also retreat upwardly.

With this construction, a contact portion A of the substrate 2 is brought in close contact with the upper surface of the support ring 1d by the dead weight of the substrate 2. In addition, a contact portion B of the support ring 1d is likewise brought in close contact with the upper surface of the rim 6d by the dead weight of the support ring 1d in addition to the dead weight of the substrate 2.

With respect to the substrate holder constructed as illustrated in FIG. 1, there is a need for precisely controlling the linear motion feedthrough 5 in order to improve sealability of the outer stepped part 1b relative to the rim 6c. In contrast to the substrate holder shown in FIG. 1, according to this embodiment, there is no need for precisely controlling the linear motion feedthrough 5 so far.

As described above, the vacuum film forming apparatus of the present invention is constructed such that the vacuum vessel is divided into two parts, i.e., vacuum chamber on the heating unit side and a vacuum chamber on the treatment side, and both of the vacuum chambers are isolated from each other with a substrate and a substrate holder interposed therebetween. In addition, both vacuum chambers are separately evacuated so as to produce a differential pressure therebetween. Consequently, the apparatus of the present invention offers the following advantageous effects:

(1) The apparatus can prevent a source gas from flowing into the vacuum chamber at the substrate heating unit side.

(2) The apparatus can prevent a product from being deposited on the region peripheral to the substrate heating unit.

(3) Since no product is deposited on the substrate heating unit, the running life of the substrate heating unit can be lengthened substantially.

(4) Since irregular irradiation of heat rays attributable to thermal deposition of a film does not take place, a thin film having a uniform thickness can be obtained.

(5) Since the same material as that of the thin film formed by pyrolysis of the source gas is employed for the substrate holder, no dust particle is generated.

Figure 5:
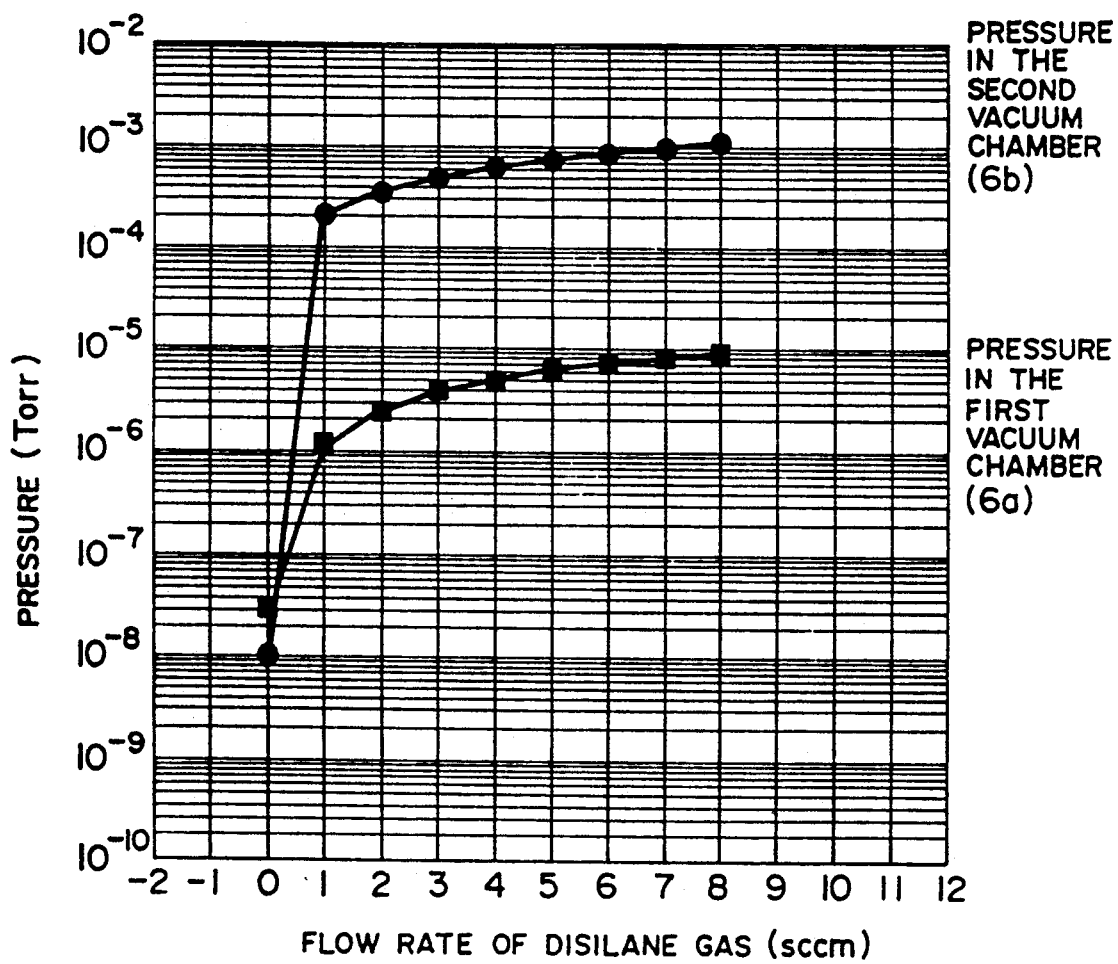
FIG. 5 shows disilane gas flow rate dependent on the pressure of the first vacuum chamber and the pressure of the second vacuum chamber, respectively.

FIG. 5 is a graph which illustrates that the pressure in the first vacuum chamber 6a on the heater side and the pressure in the second vacuum chamber 6b on the treatment side vary as the flow rate of the disilane gas varies. First, the silicon substrate 2 is heated to an elevated temperature of about 860° C. with the aid of the heater 3. Then, as the flow rate of the disilane gas varies, a silicon thin film is epitaxially grown on the silicon substrate 2.

In spite of the afore-mentioned treatment (i.e., introduction of a reaction gas into the second vacuum chamber 6b), a differential pressure having two or more orders of magnitude appears between the first vacuum chamber 6a on the heater side and the second vacuum chamber 6b on the treatment side. This means that there is very slight possibility that the disilane gas would flow into the first vacuum chamber 6a on the heater side.

Consequently, there does not arise a malfunction in that a thin film is deposited on the heater 3 for heating the substrate thereby degrading a property of the heater 3.

The pressure in the first vacuum chamber 6a of FIG. 5 is lower by three orders of magnitude than that in the first vacuum chamber 6a of FIG. 1. This results from hydrogen molecules generated by pyrolysis of disilane molecules on the silicon substrate 2. It may be considered that hydrogen molecules can easily pass through a narrow gap, for example, a gap between the silicon substrate 2 and the substrate holder 1.

It should be added that the apparatus of the present invention has the following characterizing features by virtue of the arrangement of the evacuating means for the vacuum chamber including a heater.

(1) The quantity of source gas molecules flying onto the heating unit can be reduced substantially. Thus, the quantity of deposited material around the substrate heating unit can be reduced when a source gas adapted to produce a deposited material (especially, a source gas adapted to produce a deposited material by thermal decomposition) is used for the apparatus.

(2) There is a very low possibility that gas molecules generated from the heating unit are displaced to the region around the substrate.

While the present invention has been described above with respect to two preferred embodiments thereof, it should of course be understood that the present invention should not be limited only to these embodiments but various changes or modifications may be made without departure from the scope of the invention as defined by the appended claims.

What is claimed is:

1. A vacuum film forming apparatus for depositing a semiconductor film on a film forming surface of a substrate, comprising
    a vacuum vessel having an inner wall surface, said vacuum vessel being divided into first and second vertically separated vacuum chamber portions and being provided with an isolation member on said inner wall surface between said first and second vacuum chamber portions;
    first and second evacuating means communicated with said first and second vacuum chamber portions respectively;
    a substrate heater located within said first vacuum chamber portion;
    gas supply means for supplying gas to said second vacuum chamber portion; and
    a substrate holder engageable with said isolation member, said substrate being affixed to said substrate holder by only its own weight with the film forming surface thereof facing said second vacuum chamber portion and an opposing surface thereof receiving heat directly from said substrate heater, said substrate separating and isolating said first and second vacuum chamber portions from each other thereby preventing gas from passing between said chamber portions.

2. The apparatus as claimed in claim 1 which further comprises means for displacing said substrate holder with respect to said isolation member, said means being operative to bring said substrate holder into gas tight engagement with said isolation member.

3. The apparatus as claimed in claim 1 wherein said substrate holder and the film deposited on the film forming surface of said substrate are formed of substantially the same material.

4. The apparatus as claimed in claim 1 further including actuating means for displacing said substrate holder so as to allow said substrate to be replaced with another substrate, said actuating means being arranged at a position outside of said vacuum vessel in an environmental atmosphere.

5. The apparatus as claimed in claim 1, wherein said substrate heater comprises an electric heater.

6. The apparatus as claimed in claim 1, wherein said gas supplying means comprises a nozzle through which a gas is blown toward said substrate.

7. The apparatus as claimed in claim 1, wherein the evacuating means for each of said first and second vacuum chamber portions comprises a turbo molecular pump.

8. The apparatus as claimed in claim 1, wherein the evacuating capacity of said evacuating means for said first vacuum chamber portion is smaller than the evacuating capacity of said second evacuating means for said second vacuum chamber portion.

9. The apparatus as claimed in claim 1, wherein the thin film to be deposited on said substrate is an epitaxial silicon film.

10. The apparatus as claimed in claim 1 wherein said isolation member comprises a flange located on the inner portion of said vacuum vessel between said first and second vacuum portions, said substrate holder being engageable with said flange and supporting said substrate at an outer periphery thereof.

* * * * *